United States Patent
Dobrovolny

[11] Patent Number: 6,070,061
[45] Date of Patent: May 30, 2000

[54] ADJACENT CHANNEL REJECTION IN DOUBLE CONVERSION TUNER

[75] Inventor: Pierre Dobrovolny, North Riverside, Ill.

[73] Assignee: Zenith Electronics Corporation, Glenview, Ill.

[21] Appl. No.: 08/943,916

[22] Filed: Oct. 3, 1997

[51] Int. Cl.[7] .................................................. H03D 1/22
[52] U.S. Cl. ................................. 455/150.1; 455/180.2; 455/188.2; 455/193.1; 455/311
[58] Field of Search ........................... 455/180.2, 188.2, 455/189.1, 190.1, 193.1, 311, 150.1

[56] References Cited

U.S. PATENT DOCUMENTS

| | | |
|---|---|---|
| 4,206,317 | 6/1980 | Kahn ........................................ 370/201 |
| 4,499,602 | 2/1985 | Hermeling, Jr. et al. ........... 455/180.3 |
| 4,682,359 | 7/1987 | Mistry ........................................ 380/7 |
| 5,142,369 | 8/1992 | Grubbs et al. ........................... 348/729 |
| 5,809,088 | 9/1998 | Han ...................................... 455/192.2 |
| 5,812,928 | 9/1998 | Watson, Jr. et al. ..................... 455/5.1 |

*Primary Examiner*—Daniel S. Hunter
*Assistant Examiner*—Alan T. Gantt

[57] ABSTRACT

A double conversion tuner includes a first filter that is relatively flat over a 6 MHz band at 920 MHz. A pair of series-parallel resonant circuits form notch filters that operate on the downconverted signals to economically produce a 6 MHz frequency response at 44 MHz that has excellent adjacent channel and other signal rejection.

10 Claims, 1 Drawing Sheet

ADJACENT CHANNEL REJECTION IN DOUBLE CONVERSION TUNER

BACKGROUND OF THE INVENTION AND PRIOR ART

This invention relates generally to double conversion tuners that are used in the VHF and UHF range and specifically to adjacent channel signal rejection in such tuners.

With the advent of high definition television and in particular digital signals for high definition television, the advantages of double conversion tuners, commonly used in the cable television environment, have also been recognized for the terrestrial environment. A major difficulty is the need to protect the tuner circuits from adjacent channel signals and other signals, which negatively impact the quality of signal reception and processing, especially in a digital signal environment. It will be appreciated by those skilled in the art that tailoring a frequency response to produce relatively sharp rejection slopes in the gigaHertz frequency range is a costly matter. The present invention enables such tailoring to occur in a relatively low cost manner and is therefore highly suitable for double conversion tuners intended for use in the large consumer television market.

OBJECTS OF THE INVENTION

A principal object of the invention is to provide a novel double conversion tuning system.

Another object of the invention is to provide a double conversion tuning system that provides good adjacent channel signal rejection at relatively low cost and with a minimum of easily adjustable components.

A further object of the invention is to provide a method and apparatus for double conversion tuner useful in a digital high definition television environment.

BRIEF DESCRIPTION OF THE DRAWINGS

These and other objects and advantages of the invention will be apparent upon reading the following description in conjunction with the drawings in which.

DESCRIPTION OF THE PREFERRED EMBODIMENT

Figure 1:
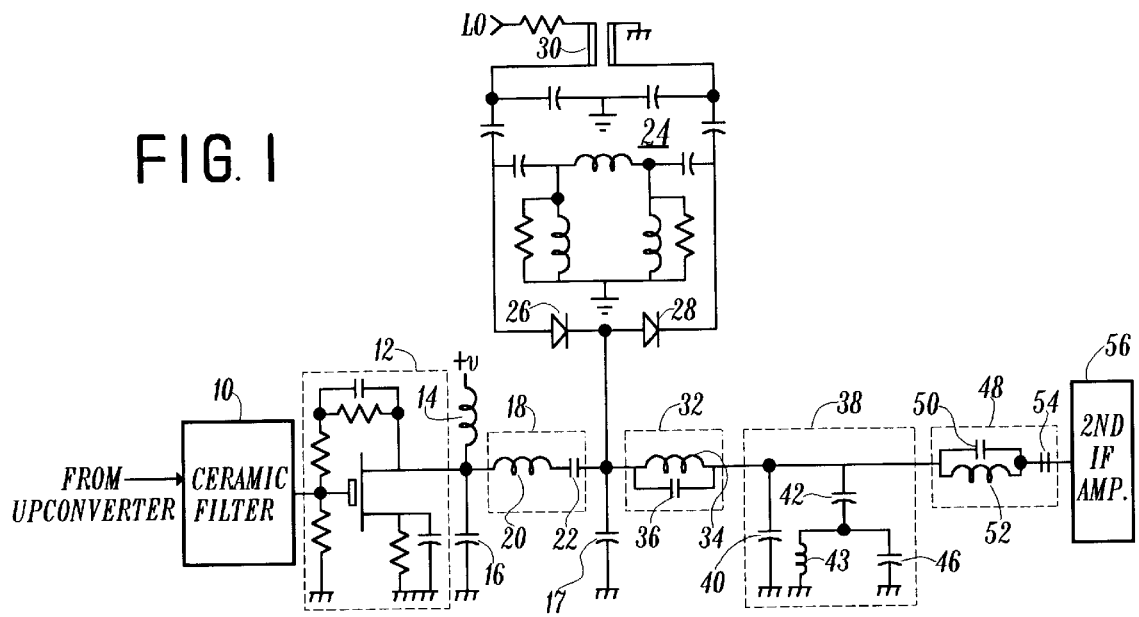
FIG. 1 is a schematic diagram of the downconverter portion of a double conversion tuner constructed in accordance with the invention.
Figure 2:
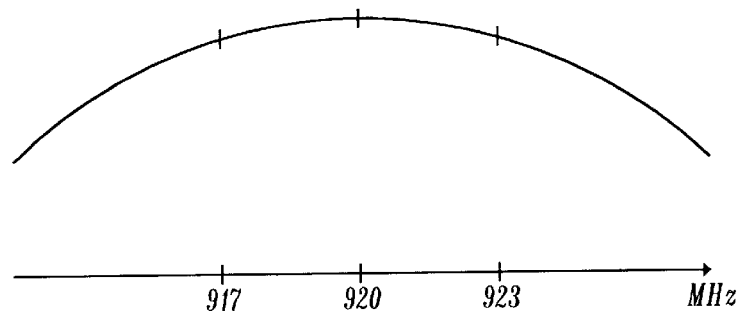
FIG. 2 illustrates the 920 MHz first IF frequency response of the downconverter.

Referring to FIG 1, the upconverted signal from the input portion (not shown) of the tuner of the invention is supplied to a ceramic filter 10 that constitutes the first filter means of the downconverter and which is responsible for providing a relatively flat frequency response over approximately a 6 MHz span at 920 MHz. The response curve is illustrated in FIG. 2 with the 6 MHz points of 917 and 923 and the center point of 920 MHz being noted. The downconverted signal is applied to a first IF amplifier 12 and applied to the input of a single balanced mixer circuit 24 that includes a pair of diodes 26 and 28. A bias circuit comprising an inductor 14 is connected between +V and ground for supplying first IF amplifier 12 with operating potential. The junction of diodes 26 and 28 is both the input (at 920 MHz) and the output (at 44 MHz) of mixer circuit 24 which also provides the ground return path for the mixer input and output signals. Circuit 24, together with balun 30, also provides a matching circuit for transforming the effective diode impedance at the local oscillator (LO) frequency of 876 MHz to the load impedance of the buffer amplifier driving the mixer. Mixer circuit 24 also provides an automatic reverse bias (self bias) for the mixer diodes that is necessary for optimum and stable mixer conversion loss and impedance. The output of first IF amplifier 12 is supplied to a series LC combination 18 that consists of an inductor 20 and a capacitor 22 having a value of 1–2 picofarads (pf). This circuit is practically an open circuit at 44 MHz and prevents loading of the mixer by the first IF amplifier at other than first IF frequencies. Circuit 18, together with capacitors 16 and 17 also implements a PI network that couples the output of the first IF amplifier 12 to the input of mixer 24 at the first IF frequency. The 920 MHz upconverted signal is downconverted to 44 MHz in mixer 24 and supplied to a parallel resonant circuit 32 that consists of an inductor 34 and a capacitor 36 which resonate at 920 MHz. The parallel resonant circuit 32 prevents loading of the first IF signal path at the mixer input with the low impedances (at 920 MHz) of resonant circuits 38 and 48, discussed below.

The 44 MHz signal is applied to a shunt connected (series-parallel resonant circuit) circuit 38 and to a series connected (series-parallel resonant circuit) 48 whose output is coupled to a high gain second IF amplifier 56. Shunt connected circuit 38 consists of a capacitor 40 that is connected in parallel with the combination of a capacitor 42 that is serially connected with a parallel connection of an inductor 44 and a capacitor 46. Shunt connected circuit 38 is connected from the output of resonant circuit 32 to ground. Series connected circuit 48 consists of a parallel connection of a capacitor 50 and an inductor 52 in series with a capacitor 54 and is connected between resonant circuit 32 and second IF amplifier 56.

Figure 3:
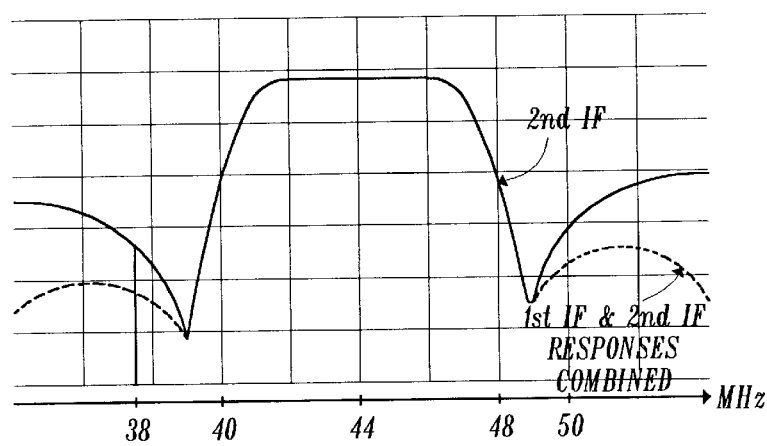
FIG. 3 illustrates the first IF 44 MHz response and the combined first and second IF frequency response.

The effects of shunt connected circuit 38 and series connected circuit 48 on the 44 MHz response characteristic is illustrated in FIG. 3, where the measured response curve is shown. As seen, the skirts of the response are quite steep due to the traps on either edge which result from circuits 38 and 48. Further, the steep skirts have been achieved in a very inexpensive manner because the traps are established at 44 MHz.

The first IF filter (usually operating around 1 gigaHertz) provides selective protection for the relatively robust downconverter mixer at a signal level where adjacent channel protection is not very critical. Thus a three pole ceramic filter of about 6 MHz bandwidth will suffice. However, the second IF amplifier is a gain block with a gain of 20 to 35 dB and may be easily overloaded by even moderately strong undesired adjacent channel signal levels. The second IF filter (operating around 44 MHz) notches out frequencies adjacent to the second IF band which are not attenuated by the first IF filter. The nature of these circuits (if correctly designed) is such that the passband response of the second IF filter resembles the response of a slightly overcoupled double tuned bandpass which is a desirable complement to the maximally flat first IF bandpass.

The attenuation of the second IF filter for frequencies displaced by more than 3 MHz from the 44 MHz center frequency, while not sufficient by itself, provides enough selective protection for the second IF gain block when combined with the first IF filter. The typical calculated (and experimentally verified) values of inductors 20, 34, 44 and 52 are on the order of tens of nonohenries—a convenient value for a small, compact and stable filter layout using inexpensive spring-type inductors. Further, by using capacitive components with reasonably small tolerances, the adjustment of the filter is limited to a simple adjustment of coils 46 and 52 to obtain the two notches at the determined frequencies. The inband frequency response shape is obtained accurately as a result of the notch adjustment thus minimizing the time required for the downconverter bandshape adjustment.

What has been described is a novel method and simple apparatus for providing a steeply skirted downconverter frequency response characteristic in a double conversion tuner with the first IF operating in the gigaHertz range of frequencies. It is recognized that numerous changes in the described embodiment of the invention will occur to those skilled in the art without departing from its true spirit and scope. The invention is to be limited only as defined in the claims.

What is claimed is:

1. A double conversion tuner, operating in the gigaHertz range, that is band-shaped to provide a sharply notched 6 MHz wide frequency band at 44 MHz, comprising:

first filter means for providing a relatively flat frequency response over substantially a 6 MHz band centered about 920 MHz;

mixer means for converting 920 MHz signals to 44 MHz signals;

second filter means for establishing a notch at one edge of the converted band for said 44 MHz signals; and third filter means for establishing a notch at the other edge of the converted band for said 44 MHz signals to produce said 6 MHz wide frequency band at 44 MHz that is sharply notched at each edge.

2. The tuner of claim 1, further including a high gain second IF amplifier and wherein:

said second filter means comprises a series-parallel resonant circuit connected in parallel with one of said mixer means and said second IF amplifier; and said third filter means comprises a series-parallel resonant circuit connected in series between the input of said second IF amplifier and said mixer means.

3. The tuner of claim 1, further including:

a 44 MHz rejection filter coupled between said first filter means and said mixer; and a 920 MHz rejection filter coupled between said mixer and said and third filter means.

4. The tuner of claim 3, wherein said first filter means comprises a ceramic filter.

5. A double conversion tuner, operating in the gigaHertz range, that is band-shaped to provide a sharply notched 6 MHz wide frequency band at 44 MHz, comprising:

a high gain second IF amplifier;

first filter means for establishing a relatively flat frequency response over substantially a 6 MHz band centered about 920 MHz;

mixer means for converting 920 MHz signals to 44 MHz signals; second filter means for establishing a notch at one edge of the converted band for said 44 MHz signals, said second filter means comprising a series-parallel resonant circuit connected in parallel with one of said mixer means and said second IF amplifier; and third filter means for establishing a notch at the other edge of the converted band for said 44 MHz signals and cooperating with said second filter means for producing a 6 MHz wide frequency band at 44 MHz that is sharply notched at each edge, said third filter means comprising a series-parallel resonant circuit connected in series between said mixer means and said second IF amplifier.

6. The tuner of claim 5, wherein said first filter means comprises a ceramic filter.

7. A method of economically band-shaping the frequency response of a double conversion tuner, operating at gigaHertz frequencies, for providing a sharply notched 6 MHz wide frequency band at 44 MHz comprising:

providing a first filter means having a substantially flat frequency response over a 6 MHz band at about 920 MHz;

downconverting 920 MHz signals to 44 MHz signals in a mixer;

providing a second filter means for establishing a notch at one edge of the 44 MHz signal frequency response band; and providing a third filter means for establishing a notch at the other edge of the 44 MHz signal frequency response band.

8. The method of claim 7, further comprising:

providing a high gain second IF amplifier;

the second filter means comprising a series-parallel resonant circuit connected in parallel with one of the mixer and the second IF amplifier; and the third filter means comprising a series-parallel resonant circuit connected in series the mixer and the second IF amplifier.

9. The method of claim 8, further comprising:

supplying input signals to the mixer through a 44 MHz rejection filter; and supplying output signals from the mixer through a 920 MHz rejection filter.

10. The method of claim 9, wherein the first filter means comprises a ceramic filter.

* * * * *